US010180475B2

(12) United States Patent
Idiyatullin et al.

(10) Patent No.: US 10,180,475 B2
(45) Date of Patent: Jan. 15, 2019

(54) SYSTEMS AND METHODS FOR MULTIBAND SWEEP IMAGING WITH FOURIER TRANSFORMATION

(71) Applicant: REGENTS OF THE UNIVERSITY OF MINNESOTA, St. Paul, MN (US)

(72) Inventors: Djaudat Idiyatullin, St. Paul, MN (US); Curt Corum, St. Paul, MN (US); Michael Garwood, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 41 days.

(21) Appl. No.: 15/305,708

(22) PCT Filed: Apr. 24, 2015

(86) PCT No.: PCT/US2015/027465
§ 371 (c)(1),
(2) Date: Oct. 21, 2016

(87) PCT Pub. No.: WO2015/164709
PCT Pub. Date: Oct. 29, 2015

(65) Prior Publication Data
US 2017/0074957 A1 Mar. 16, 2017

Related U.S. Application Data

(60) Provisional application No. 61/983,764, filed on Apr. 24, 2014.

(51) Int. Cl.
*G01R 33/48* (2006.01)
*G01R 33/483* (2006.01)

(52) U.S. Cl.
CPC ..... *G01R 33/4816* (2013.01); *G01R 33/4835* (2013.01)

(58) Field of Classification Search
USPC .......................... 324/300–322; 600/407–435
See application file for complete search history.

(56) References Cited

U.S. PATENT DOCUMENTS 3,975,675 A * 8/1976 Dunand ............. G01R 33/3607
324/312
6,573,715 B2 * 6/2003 King ..................... G01R 33/60
324/300

(Continued)

FOREIGN PATENT DOCUMENTS

WO  WO2013030585 A1  3/2013

OTHER PUBLICATIONS

Djaudat et al., Gapped Pulses for Frequency-Swept MRI, PubMed Central, 2008 (retrieved on Jul. 8, 2015 from internet url: http://www.ncbi.nlm.nih.gov/pmc/articles/PMC2566780/).

(Continued)

*Primary Examiner* — Melissa Koval
*Assistant Examiner* — Tiffany Fetzner
(74) *Attorney, Agent, or Firm* — Quarles & Brady LLP

(57) ABSTRACT

Systems and methods for magnetic resonance imaging ("MRI") using a frequency swept excitation that utilizes multiple sidebands to achieve significant increases in excitation and acquisition bandwidth are provided. The imaging sequence efficiently uses transmitter power and has increased sensitivity as compared to other techniques used for imaging of fast relaxing spins. Additionally, the imaging sequence can provide information about both fast and slow relaxing spins in a single scan. These features are advantageous for numerous MRI applications, including musculoskeletal imaging, other medical imaging applications, and imaging materials.

10 Claims, 8 Drawing Sheets

(56) References Cited

U.S. PATENT DOCUMENTS

| | | | | |
|---|---|---|---|---|
| 6,670,811 B2* | 12/2003 | Wind | G01R 33/307 | 324/307 |
| 6,836,115 B2* | 12/2004 | Wind | G01R 33/54 | 324/307 |
| 7,944,206 B2* | 5/2011 | Frydman | G01R 33/4822 | 324/307 |
| 8,519,707 B2* | 8/2013 | Corum | G01R 33/4641 | 324/307 |
| 8,750,642 B2* | 6/2014 | Corum | G06T 5/006 | 382/131 |
| 8,933,698 B2* | 1/2015 | Corum | G01R 33/4641 | 324/307 |
| 9,880,243 B2* | 1/2018 | Corum | G01R 33/4616 | |
| 2001/0028247 A1* | 10/2001 | King | G01R 33/60 | 324/312 |
| 2002/0125887 A1* | 9/2002 | Wind | G01R 33/307 | 324/309 |
| 2003/0210046 A1* | 11/2003 | Wind | G01R 33/307 | 324/307 |
| 2007/0188172 A1 | 8/2007 | Garwood et al. | | |
| 2010/0001727 A1* | 1/2010 | Frydman | G01R 33/4822 | 324/310 |
| 2010/0253341 A1* | 10/2010 | Corum | G01R 33/4641 | 324/309 |
| 2013/0043867 A1* | 2/2013 | Corum | G01R 33/4616 | 324/309 |
| 2013/0084023 A1* | 4/2013 | Corum | G01R 33/565 | 382/264 |
| 2013/0320980 A1* | 12/2013 | Corum | G01R 33/4816 | 324/314 |
| 2016/0139222 A1* | 5/2016 | Frydman | G01R 33/483 | 324/309 |
| 2017/0074957 A1* | 3/2017 | Idiyatullin | G01R 33/4816 | |

OTHER PUBLICATIONS

Garwood, MRI of Fast-Relaxing Spins, PubMed Central 2013 (retrieved on Jul. 8, 2015 from internet url: http://www.ncbi.nlm.nih.gov/pmc/articles/PMC3602136/).

International Search Report and Written Opinion for PCT/US2015/027465 filed Apr. 24, 2015 dated Jul. 27, 2015.

* cited by examiner

SYSTEMS AND METHODS FOR MULTIBAND SWEEP IMAGING WITH FOURIER TRANSFORMATION

CROSS REFERENCE TO RELATED APPLICATIONS

This application represents the U.S. National Stage of International Application No. PCT/US2015/027465. filed Apr. 24, 2015, which claims the benefit of U.S. Provisional Patent Application Ser. No. 61/983,764, filed on Apr. 24, 2014, and entitled "SYSTEMS AND METHODS FOR MULTIBAND SWEEP WITH FOURIER TRANSFORMATION," both of which are herein incorporated by reference in their entirety.

STATEMENT REGARDING FEDERALLY SPONSORED RESEARCH

This invention was made with government support under EB015894, RR023730, RR027290, RR008079, and CA139688 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for using multiband radio frequency ("RF") pulses in MRI.

The distribution of transverse relaxation times ("$T_2$") in tissues covers about six orders of magnitude, from microseconds (e.g., for bound water and macromolecules) up to seconds (e.g., for cerebrospinal fluid). For diagnostic purposes, it is very useful to be able to observe changes of spin density and relaxation parameters due to tissue pathology. For these reasons, there has been much interest in MRI methods that are capable of detecting a wide range of short $T_2$s.

There are at least a four different clinically applicable short $T_2$ sensitive MRI methods, including ultrashort echo time ("UTE") imaging; sweep imaging with Fourier transformation ("SWIFT"; FID-projection imaging, which may also called BLAST, RUFIS, WASPI, or zero TE ("ZTE"); and ZTE combined with single point imaging ("SPI"), such as the PETRA method. All of these methods utilize a radial readout technique.

To increase the range of detectable short $T_2$s, the excitation and acquisition bandwidths must be increased, and the strength of the frequency-encoding (e.g., readout) gradients must be increased. These requirements are not easily accomplished in practical implementations.

For example, in ZTE and SWIFT sequences, an excitation pulse is applied in presence of readout gradients and, therefore, needs to be broadband enough to cover the entire field-of-view ("FOV") at the readout bandwidth. An excitation bandwidth of the square pulse used in ZTE is inversely proportional to the length of the pulse; thus, increasing the excitation bandwidth requires increasing the amplitude of the RF pulse, which is limited by RF hardware (e.g., peak amplifier power). SWIFT and UTE are less prone to this restriction. For instance, in SWIFT, longer frequency swept pulses are used. In UTE, the excitation pulse is applied before turning on the gradients and, therefore, the excitation bandwidth needs to cover only the resonance lines of the spins. ZTE has fewer problems during readout relative to UTE or SWIFT, however.

In the UTE sequence the "bottle neck" is the duration of gradient ramping time, which physically cannot be shortened enough due to inductance of gradient coils and eddy currents. At the same time, the ring down time of RF coil restricts using regular SWIFT with a time-shared acquisition at high bandwidths.

Thus for various reasons, the existing pulse sequences for imaging short $T_2$ signals are limited to a maximum achievable bandwidth that may be insufficient to resolve all excited short $T_2$ signals and to avoid off-resonance artifacts (e.g., blurring) in radial imaging.

Thus, there remains a need for providing an imaging sequence capable of imaging a wide range of short $T_2$ signals that also has increased efficiency at high bandwidths relative to other methods.

SUMMARY OF THE INVENTION

The present invention overcomes the aforementioned drawbacks by providing a method for producing an image of a subject with a magnetic resonance imaging ("MRI") system. The method includes directing the MRI system to perform a pulse sequence that includes applying a sweeping frequency excitation having a duration, the sweeping frequency excitation comprising a plurality of spaced apart radio frequency ("RF") excitation pulses each having a pulse width and an inter-pulse spacing selected such that the sweeping frequency excitation simultaneously excites multiple different resonance frequencies at sidebands determined by the inter-pulse spacing. The pulse sequence also includes acquiring a time domain signal during the duration, the time domain signal being based on evolution of the spins. An image is then produced from the acquired time domain signal.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1A:
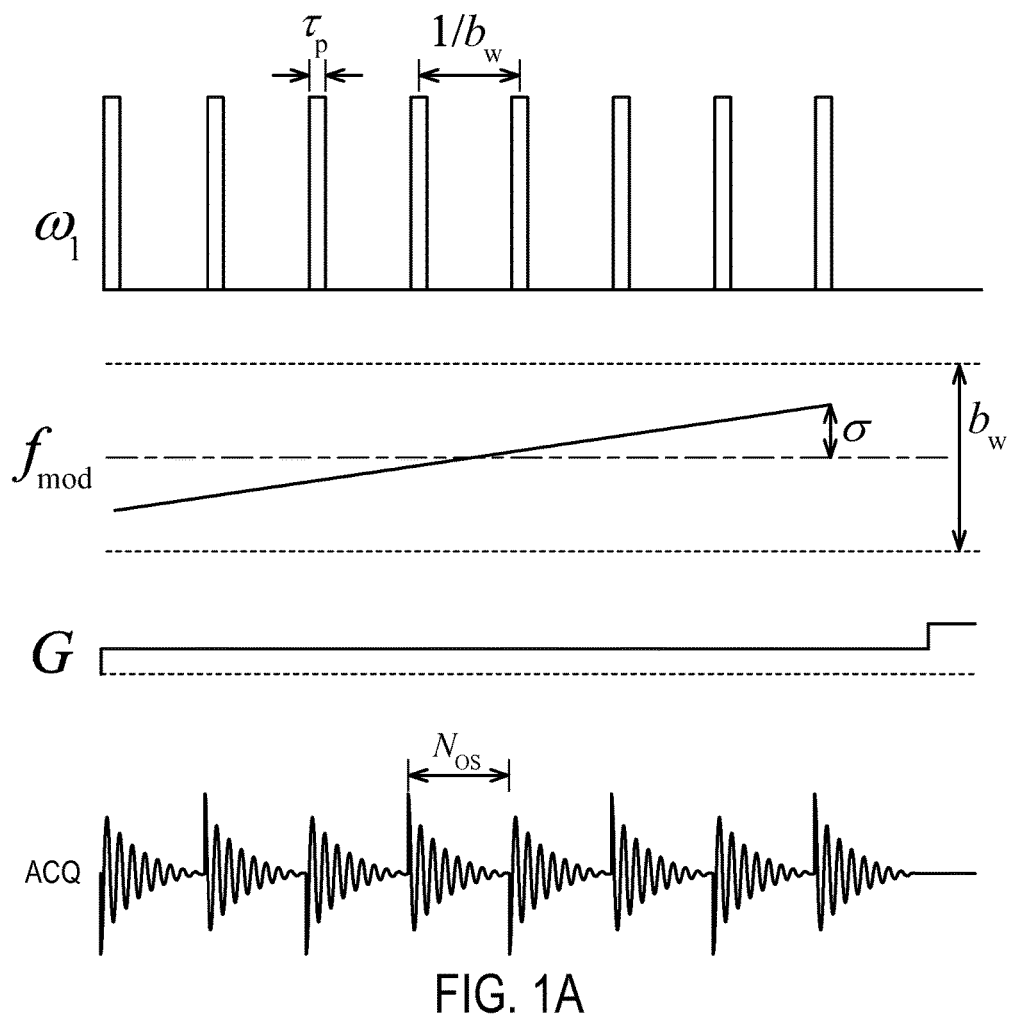
FIG. 1A is an example of one projection-block of an example pulse sequence that implements the present invention.

Described here are systems and methods for acquiring magnetic resonance imaging ("MRI") data using a frequency swept excitation that utilizes multiple sidebands to achieve significant increases in excitation and acquisition bandwidth. This imaging method can be referred to as multiband sweep imaging with Fourier transformation ("MB-SWIFT"). Due to its tailored (e.g., striped) excitation pattern, MB-SWIFT efficiently uses transmitter power and has increased sensitivity as compared to other techniques used for imaging of fast relaxing spins. Thus, the methods described here are less restricted by MRI system hardware. MB-SWIFT is also capable of achieving higher flip angles than are achievable with sequences such as ZTE while using the same scanning parameters (e.g., bandwidth, acquisition time, RF pulse amplitude). Additionally, MB-SWIFT can provide information about both fast and slow relaxing spins in a single scan. These features are advantageous for numerous MRI applications, including musculoskeletal imaging. The MB-SWIFT imaging technique can be utilized for traditional MRI, in which hydrogen nuclei are imaged; however, it can also be readily adapted to image other nuclear species, including, for example, phosphorous, sodium, and so on.

As an example, the systems and methods described here can implement a frequency swept excitation technique referred to as sweep imaging with Fourier transformation ("SWIFT") and described in U.S. Pat. No. 7,403,006, which is herein incorporated by reference in its entirety.

A frequency swept excitation is achieved by exciting nuclear spins using a radio frequency ("RF") sweep. In some embodiments, the RF excitation includes a series of pulses, each pulse having an excitation segment and a quiescent segment. The frequency or phase is then swept within each of these pulses. A signal is acquired as a time domain signal during the quiescent segment of each pulse. The acquired signal is treated as a signal that varies as a function of time and is processed in the time domain. After signal acquisition, the signal is processed, for example using a correlation method or a convolution, to correct the acquired signal by separating the spin system spectrum. The processed signal can then be used to reconstruct an image of the underlying object or subject. Generally, the method provides for fast and quiet MRI. Standard MRI scanners, such as those described below, may be programmed to use the frequency swept excitation technique.

In some embodiments, the frequency swept excitation uses a time shared acquisition by incorporating an excitation segment and a quiescent segment during the RF sweep, such that excitation and acquisition are performed nearly simultaneous.

The systems and methods described here make use of a multiband excitation to cover a larger excitation bandwidth while using relatively small average power. In the presence of the readout gradient, the MB-SWIFT excitation excites a striped projection. The multiband excitation allows flexible manipulation of the amplitude and width of excited sidebands. Similar to SWIFT, in MB-SWIFT the acquisition occurs during the excitation, which makes this sequence sensitive to short $T_2$s. The MB-SWIFT sequence yields increased sensitivity and reduced power deposition relative to other methods at high bandwidth, and additionally allows analysis of $T_2$ distributions.

In general, the swept frequency excitation includes a plurality of sub-pulses that are spaced apart by a pulse interval, $\Delta t$, and each sub-pulse has a width, $\tau_p$. When the pulse widths are much shorter than the pulse interval, then the excitation is approximately equivalent to the superposition of a number of weak selective RF pulses with frequencies that are spaced $b_w = 1/\Delta t$ Hz apart, which may also be referred to as the width of a nominal baseband. The excitation can thus be viewed as including the excitation of these "sidebands," which are symmetrically disposed with respect to the transmitter frequency at $v_0$, $v_0 + b_w$, $v_0 + 2b_w$, and so on. For spins whose resonance frequency is close to one of these sideband conditions, the MB-SWIFT excitation acts like a weak selective pulse.

FIG. 1A schematically illustrates one projection-block of an example MB-SWIFT pulse sequence. In this example, a chirp pulse is used and only the gradient, G, orientation is changed from projection to projection. In contrast to the original SWIFT pulse, fewer gaps, $N_G$, are used in this example, thereby greatly reducing the transmitter duty cycle, $$d_c = \tau_p b_w \tag{1}.$$

To deliver a multiband property, the sequence must contain at least two pulses (i.e., $N_G > 1$) applied in the presence of the same magnetic field gradient. In some embodiments, a higher oversampling value, $N_{OS}$, which is equal to the number of samples in each gap, can be implemented. The amplitude of the frequency modulation, $\sigma$, in MB-SWIFT is variable in the range $0 \leq \sigma \leq b_w/2$. In original SWIFT, the frequency modulation is usually fixed and equal to $b_w/2$.

The gapped excitation illustrated in FIG. 1A creates sidebands with amplitudes, $$A_m = \text{sinc}(md_c) \tag{2};$$

where m is the sideband order. The idea of MB-SWIFT is to use sidebands for the excitation of the imaged object. In one implementation of MB-SWIFT, the width of a nominal baseband, $b_w$, is matched to the linear width of the voxel (in frequency units). Thus, the matrix size, N, will be equal to number of sidebands covering the linear size of the FOV, and $N = N_{OS}$.

Figure 1B:
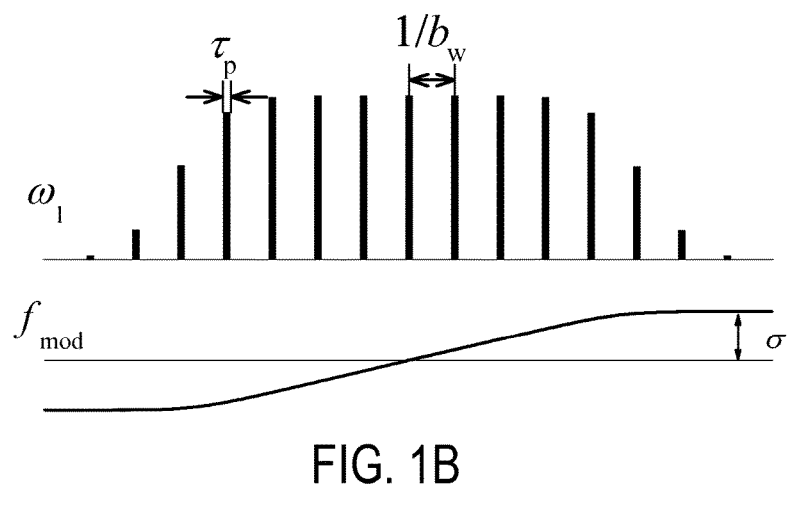
FIG. 1B is an example of an alternative sweeping frequency excitation that can be used in the projection-block of FIG. 1A.

It will be appreciated by those skilled in the art that frequency modulations, $f_{mod}$, other than the one illustrated in FIG. 1A can be used to create frequency-modulated pulses. For instance, as illustrated in FIG. 1B, a stretched hyperbolic secant ("HSn") frequency-modulated pulse can also used. In the particular example of FIG. 1B, an HS4-type frequency-modulated pulse is shown. As seen in this example, the envelope of the excitation pulses does not need to be rectangular, as is the one in FIG. 1A; instead, any suitable pulse envelope can be used.

Figure 2:
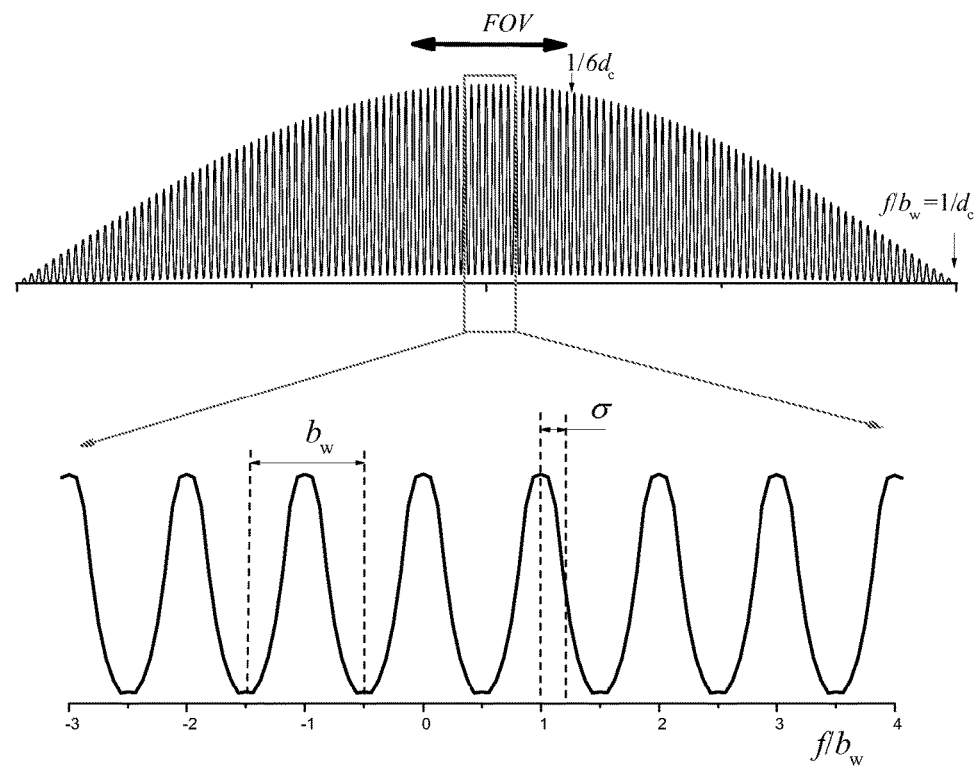
FIG. 2 is an example of a frequency excitation profile that can result in some implementations of the present invention.

FIG. 2 represents the magnitude of an example gapped excitation profile. The example in FIG. 2 is for the case where $\sigma < b_w/2$ when the profile looks like a comb. The abscissa is frequency normalized by $b_w$. The integer part of $f/b_w$ is equal to the corresponding sideband's order, m. According to Eqn. (2), in this example the sideband amplitudes are $A_m = 0$ when the sideband order $m = \text{int}(1/d_c)$.

For imaging applications generally, and especially for steady state imaging applications, it is important to keep the excitation as uniform as possible throughout the FOV. For instance, in case of a square hard pulse, the desirable excitation bandwidth matched with the FOV, and having less than five percent falloff at the edges of the bandwidth, may be equal to ⅓ of the inversed length of the pulse. In practical implementations of the ZTE sequence, due to limited RF amplitude, this requirement is frequently violated in order to increase the flip angle. With MB-SWIFT, however, the flip angle can be increased without violating this requirement. Accordingly, in the case of MB-SWIFT, the sub-pulse duration, $\tau_p$, should be chosen as $\tau_p=1/(3Nb_w)$. In this case the maximum sideband order is equal to $m_{max}=\text{int}(1/(6d_c))$, which defines the edges of FOV, as shown in FIG. 2.

It can therefore be seen that MB-SWIFT does not excite an object continuously, but excites bands, or strips, in or across the object. The width of the excitation strips is selected to be equal to or smaller than the linear size of a voxel in the final image of the object, and thus can be regulated by the relationship between $\sigma$ and $b_w$. Due to the uncertainty principle, the width of strips could not be smaller than $1/T_p$, where $T_p=N_G/b_w$ is a total pulse length. As a result, the fraction of the excited part of a voxel, p, could be estimated as, $$p = \frac{\left(2\sigma + \frac{b_w}{N_G}\right)}{b_w} = \frac{\left(\frac{2\sigma N_G}{b_w}+1\right)}{N_G}. \quad (3)$$

Thus, the smallest excited fraction is determined by $1/N_G$ when $\sigma=0$.

After acquisition, the time domain response signal, r(t), is Fourier transformed ($\Im\{r(t)\}\to R(\omega)$) and correlated with the pulse function, x(t), in the frequency domain ($\Im\{x(t)\}\to X(\omega)$) with complex conjugate multiplication by the pulse function, $$H(\omega) = \frac{R(\omega)X^*(\omega)}{|X_R(\omega)|^2}. \quad (4)$$

In difference from the original SWIFT method, here the normalization by $|X(\omega)|$ is replaced by a regularized argument to avoid the noise amplification between the sidebands. After that, the signal is inverse Fourier transformed and chopped after the first $N_{OS}$ samples. In some other embodiments, such as those described below, the first $N_{SR}N_{OS}$ samples are kept. This down sampling procedure yields the desired spoke in k-space, which in the frequency domain presents the average amplitudes of excited bands in the simplest case of one point per stripe along the projection.

Figure 3:
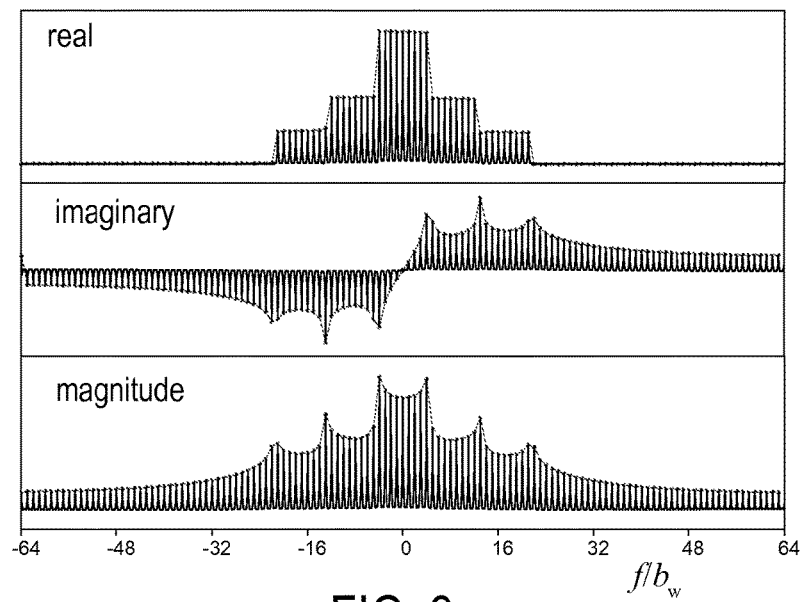
FIG. 3 is an example of a simulated object imaged in accordance with some embodiments of the present invention.

Simulated MB-SWIFT data and the corresponding strip-averaged projection of a stepped object are presented in FIG. 3. In actual implementations, the few first samples under RF pulse and coil ring down time will be missed and could be predicted based on good points or measured during a separate experiment that could be carried out with lower bandwidth, such as with ZTE. After this procedure, the down-sampled k-space data are used for the reconstruction of the image. As one example, gridding can be used for reconstruction, but any other radial reconstruction scheme could similarly be utilized, as can other algebraic reconstruction techniques.

Usually, increasing the spatial resolution in an imaging application requires increasing the acquisition time, which makes sampling of fast decaying components less optimal. The spatial resolution in the MB-SWIFT sequence described above was determined by the number of samples, $N_{OS}$, in the gaps, which was equal to the matrix size $N=N_{OS}$. The sub-voxel excitation in the case of MB-SWIFT, however, includes additional spatial information that can be used to enhance the spatial resolution without increasing the acquisition time.

Figure 4:
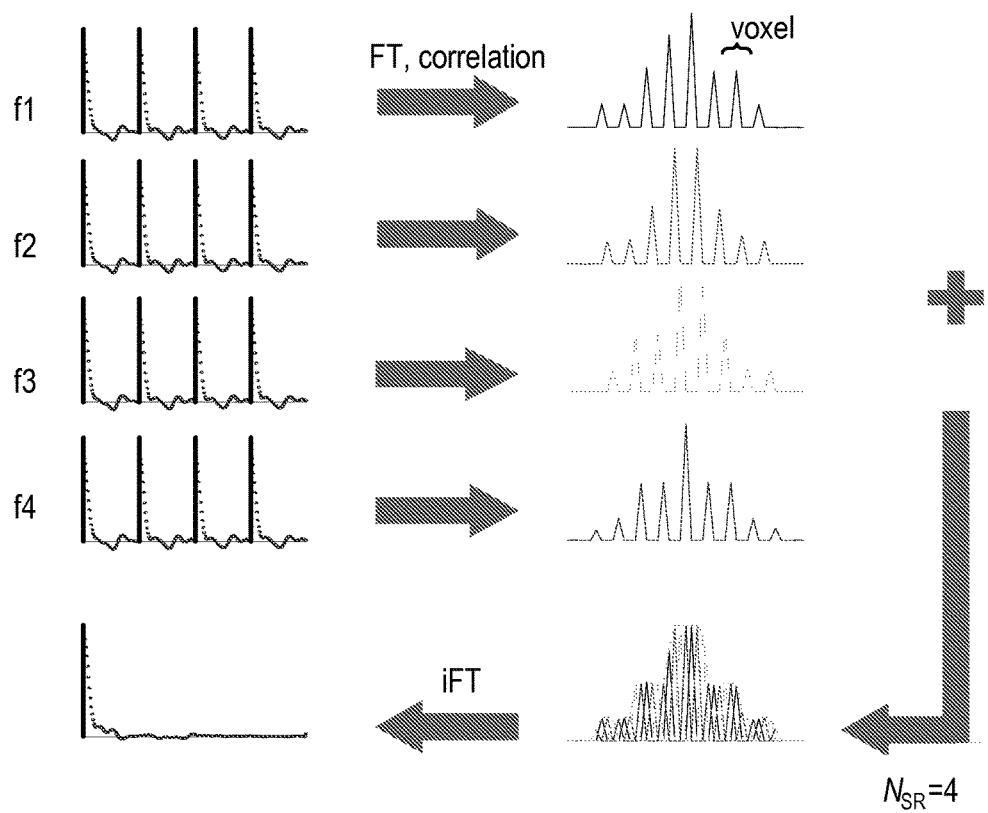
FIG. 4 illustrates one example of a method for increasing spatial resolution, using a prepared amplitude modulation space, in accordance with some embodiments of the present invention.

In some embodiments, resolution enhancement can be achieved by increasing the number of strips per voxel, as illustrated in FIG. 4. The example presented in FIG. 4 uses narrow banded excitation (with amplitude modulation of space, $\sigma=0$) and four separate scans with subsequent shifting of the carrier frequency by $b_w/4$. In the example illustrated in FIG. 4, four acquisitions were performed with $N_G=4$, $N_{OS}=64$, $N_{SR}=4$ and each with different off-resonances ($f_1=0$, $f_2=b_w/4$, $f_3=b_w/2$, $f_4=3b_w/4$). Data from these acquisitions were combined after FT and correlation was performed to one FID with $N_{SR}*N_{OS}$ number of points. For example, the data can be combined by computing the average of the projections, which gives a projection with fourfold higher resolution. The parameter, $N_{SR}$, describes the recovered resolution, which is limited in practice by $N_G$.

Figure 5:
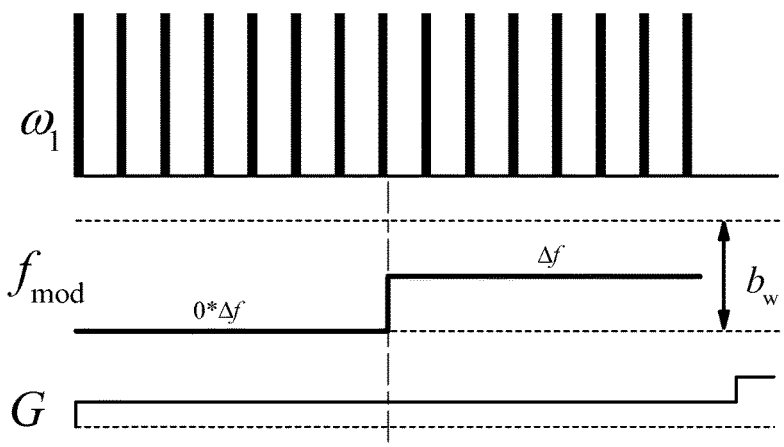
FIG. 5 is an example of one projection-block of an example pulse sequence that implements a stepped frequency modulation.

In some other embodiments, the excitation of more than one strip per $b_w$ can be achieved during a single readout, as shown in FIG. 5, by using a stepped-shifting of the excitation frequency. Images are then reconstructed using correlation and forward FT using the first $N=N_{SR}N_{OS}$ data points. In the example illustrated in FIG. 5, $N_{SR}=2$, which is equal to the number of frequency steps.

The basic idea of using the sequences illustrated in FIG. 4 and FIG. 5 is the same; that is, to increase the resolution by increasing the number of excitation strips per voxel. However, the realization of these two techniques is different. In the case illustrated in FIG. 4, strips are excited independently during different repetition cycles, but in the case illustrated in FIG. 5, the strips are excited sequentially in the presence of transverse coherence. It is contemplated that this latter technique will result in different sensitivity to some dynamic processes, such as flow.

Figure 6:
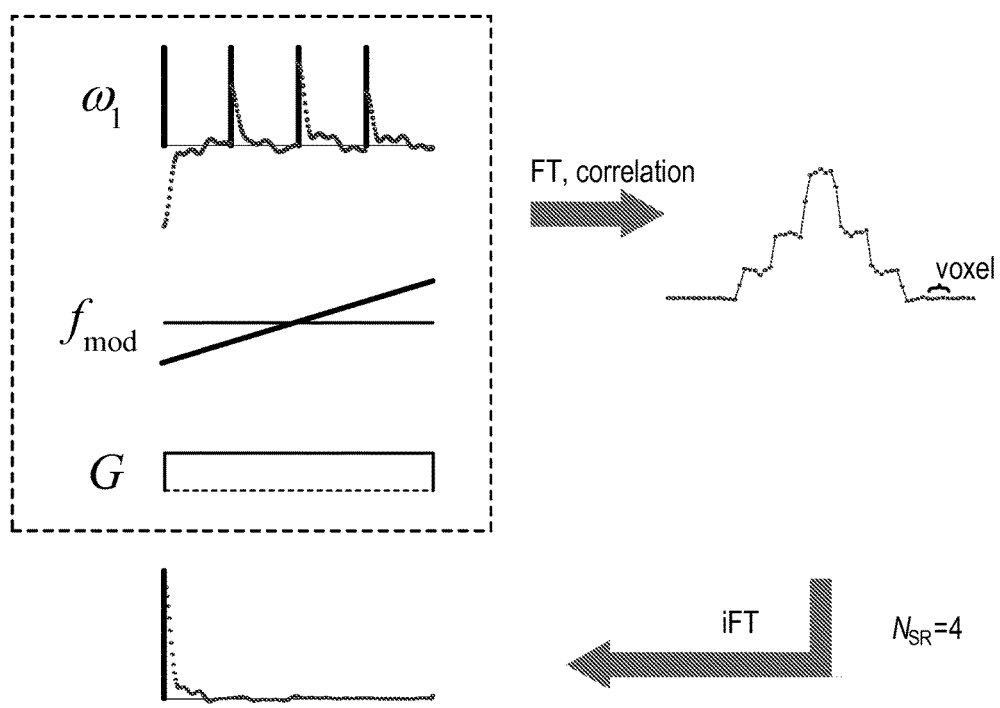
FIG. 6 illustrates another example of a method for increasing spatial resolution, using a prepared phase modulation space, in accordance with some embodiments of the present invention.

In some other embodiments, resolution can be enhanced by increasing the number of samples per strip, as illustrated in FIG. 6. In this example, multiple samples are acquired per voxel using a sequence of pulses with $N_G=4$, $N_{OS}=64$, and a linear frequency modulation that excites the whole voxel. This pulse sequence results in a quadratic phase modulation inside each voxel. Data from these acquisitions were Fourier transformed and correlation was performed to a single FID with $N_{SR}*N_{OS}$ number of points, with $N_{SR}=N_G$.

Figure 7:
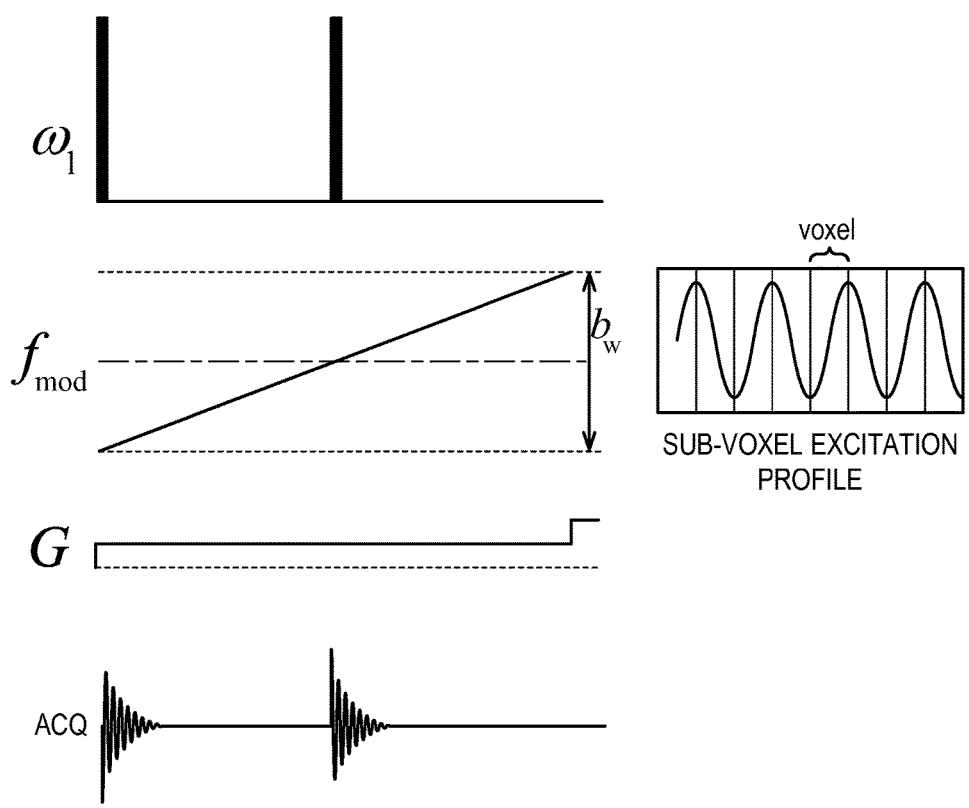
FIG. 7 illustrates an example of a method for increasing spatial resolution using a sub-voxel excitation profile.

Another practical example of increasing resolution using increased sampling per sideband is illustrated in FIG. 7, which shows a two-pulse MB-SWIFT sequence with $\sigma=b_w/2$, $p=1$, and $N=2*Nos$. After correlation and forward FT, N resolved points are obtained in the time domain.

Figure 8:
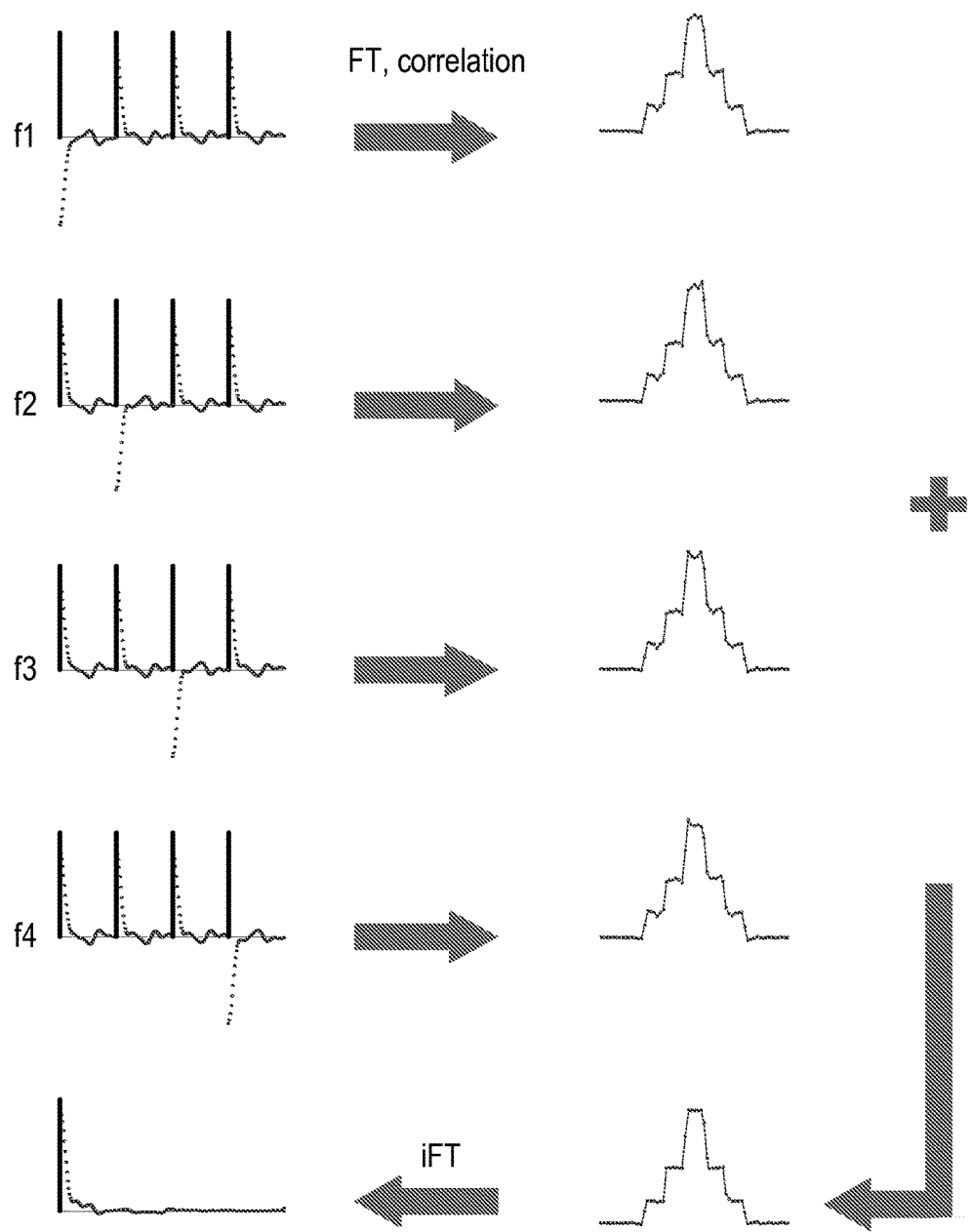
FIG. 8 illustrates a gap cycling scheme for averaging uneven excitations.

It will be appreciated by those skilled in the art that there are many different schemes that could be used for the realization of super-resolution scheme. For instance, the methods described above could be used in any suitable combination. In practice, however, it may be important to choose the scheme that will allow the most even excitation of the combined points to avoid undesirable artifacts. Residual uneven excitation could be averaged out with gap-cycling, as illustrated in FIG. 8, which illustrates a gap cycling scheme that averages uneven excitations for each of four individual sequential excitations, with $N_G=4$, $N_{OS}=64$, in this particular example Below, an estimation of the power consumption of the MB-SWIFT sequence is provided and compared with a ZTE sequence using the same excitation spectral width, $s_w$, which is equal to $s_w=b_w N_{OS}$.

The peak amplitudes needed for excitation to a flip angle $\theta$ in the bandwidth $pb_w$, using a gapped chirp pulse can be approximated with, $$B_{1,max}^{chirp} \approx \frac{\theta p b_w}{\gamma d_c \sqrt{R}}; \quad (5)$$

where $R=pb_w T_p=pN_G$. To evenly excite a bandwidth equal to $s_w$, the parameters $\tau_p$ and $d_c$ are selected as $\tau_p=1/s_w$ and $d_c=\tau_p b_w=1/N_{OS}$, respectively. Eqn. (5) can therefore be rewritten as, $$B_{1,max}^{chirp} \approx \frac{s_w \theta}{\gamma} \sqrt{\frac{p}{N_G}}; \quad (6)$$

The similar relation for RF amplitudes for one square pulse excitation could be written as, $$B_{1,max}^{square} \approx s_w \theta \quad (7).$$

Thus, if relaxation processes are not counted, the flip angle at the strips will be increased by $\sqrt{p/N_G}$ relative to a square pulse using the similar RF amplitude, resulting from the coherent buildup of signal during repeated sub pulses.

There are some particular considerations for finding an optimal flip angle during a fast steady-state acquisition, in which the repetition time ("TR") is much shorter than the longitudinal relaxation time, $T_1$. After each TR, only part of the voxel, p, is excited and at the same time the magnetization in the other parts of the voxel is recovering, which increases an effective TR. Changing the orientation of projections (or excited strips) every TR results in excitation of the different parts of the voxel. Because of this, on average, a full voxel will be effectively excited in time increased by $1/p$ times the TR. Considering a fast repetition regime and small flip angles, which is true for many cases, there is a square root dependency between $\theta_E$ and TR, $$\theta_E \approx \sqrt{\frac{2T_R}{T_1}}. \quad (8)$$

Thus, in the case of a strip excitation with TR increased $1/p$ times, the flip angle, $\theta$, should be increased $\sqrt{1/p}$ times. When resolution enhancement is used, such as by using one or more of those methods described above, the TR becomes shorter. For example, TR may be $N_{SR}$ times shorter, in which case the MB-SWIFT sequence requires considerably less RF amplitude, $$\frac{B_{1max}^{ZTE}}{B_{1max}^{MBSWIFT}} \approx \sqrt{N_{SR}}. \quad (9)$$

Figure 9:
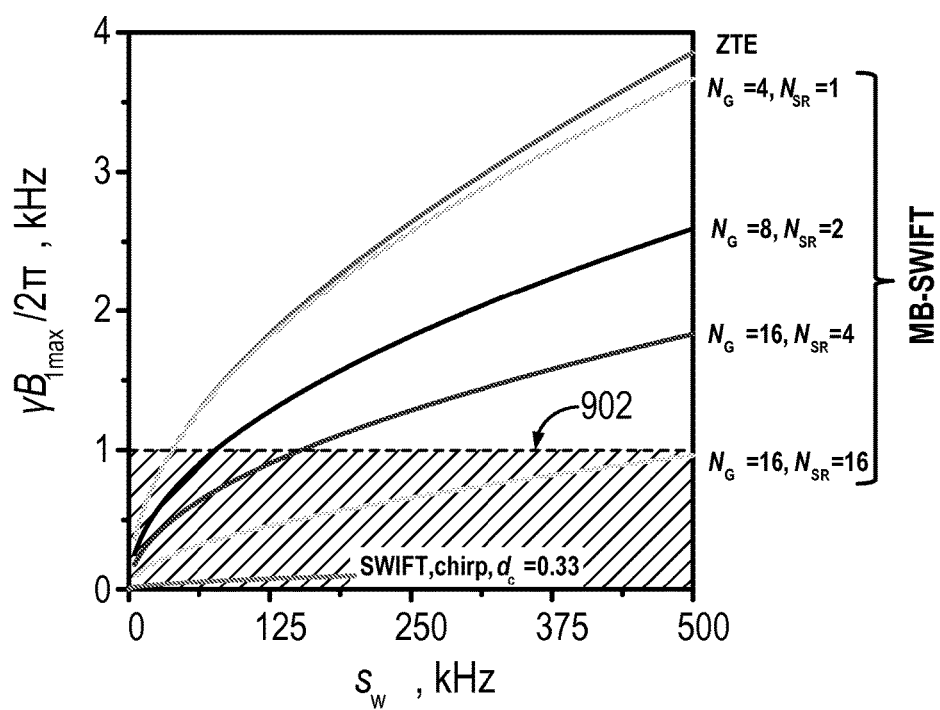
FIG. 9 depicts calculated RF amplitudes needed for exciting an Ernst angle under different imaging techniques.

For the sake of comparison, FIG. 9 illustrates the calculated RF amplitudes for different schemes. The curve for SWIFT is truncated before reaching high bandwidth because this region is not practically attainable with SWIFT. The cross-hatched region area 902 shows the RF amplitudes that can be practically generated using typical, clinical RF coils. Thus, MB-SWIFT has intermediate RF power efficiency between ZTE and standard SWIFT.

As described above, in MB-SWIFT imaging, each voxel can be excited fully or partially and the parameter, p, which represents the fraction of the excited portion of the voxel, can be equal to or less than 1. The SNR of a signal acquired following strip excitation under optimal conditions has two competing effects. On the one hand, due to partial voxel excitation, the signal energy decreases. That is, in the presence of random thermal noise, the SNR at the strip is less than the SNR for the case of full voxel excitation by a factor of $\sqrt{1/p}$. However, as also described above, the flip angle in this case is increased by a factor of $\sqrt{1/p}$. Thus, in the Ernst condition, the one effect compensates the other and keeps SNR similar to the case of full excitation SNR.

Figure 10:
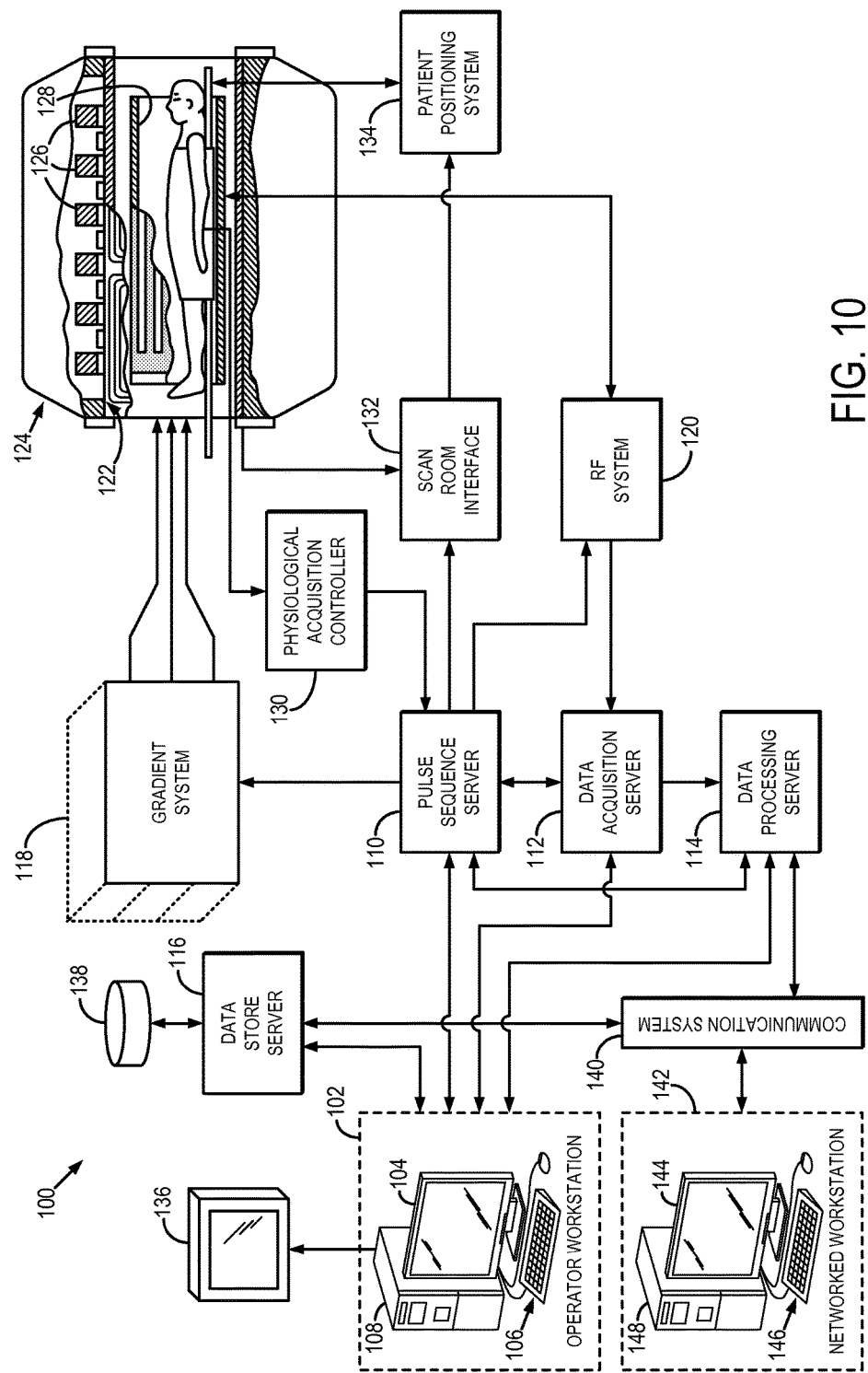
FIG. 10 is a block diagram of an example of a magnetic resonance imaging ("MRI") system.

Referring particularly now to FIG. 10, an example of a magnetic resonance imaging ("MRI") system 100 is illustrated. The MRI system 100 includes an operator workstation 102, which will typically include a display 104; one or more input devices 106, such as a keyboard and mouse; and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 10), in order to perform the prescribed magnetic resonance pulse sequence. Responsive magnetic resonance signals detected by the RF coil 128, or a separate local coil (not shown in FIG. 10), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays (not shown in FIG. 10).

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (10);$$

and the phase of the received magnetic resonance signal may also be determined according to the following relationship:

$$\varphi = \tan^{-1}\left(\frac{Q}{I}\right). \quad (11)$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 10), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method of producing a magnetic resonance (MR) image of a subject with a magnetic resonance imaging (MRI) system, the steps of the method comprising:
    (a) directing the MRI system to perform a pulse sequence that includes:
        applying a sweeping frequency excitation having a duration, the sweeping frequency excitation comprising a plurality of spaced apart radio frequency (RF) excitation pulses each having a pulse width and each of the RF excitation pulses being spaced apart by a same inter-pulse spacing that is selected such that the sweeping frequency excitation simultaneously excites multiple different resonance frequencies at sidebands determined by the selected inter-pulse spacing;

acquiring a time domain signal during the duration, the time domain signal being based on evolution of the spins; and (b) producing an MR image from the acquired time domain signal, wherein at least one dimension of a matrix size of the MR image produced in step (b) is equal to a number of the sidebands covering a field-of-view depicted in the produced MR image and wherein the number of sidebands covering the field-of-view depicted in the produced MR image is at least two.

2. The method as recited in claim 1, wherein the selected inter-pulse spacing is selected such that a linear width of a voxel in the MR image produced in step (b) is matched with a width of at least one of the sidebands that is utilized in covering the field-of-view depicted in the produced MR image.

3. The method as recited in claim 1, wherein step (b) includes Fourier transforming the acquired time domain signal in order to generate a frequency domain signal, correlating the generated frequency domain signal with a pulse function in a frequency domain in order to generate correlated signals, and producing, using a computer processor, the MR image of step (b) from the generated correlated signals.

4. The method as recited in claim 1, wherein at least one dimension of the matrix size is equal to a number of samples acquired between each spaced apart RF excitation pulse that occurs in the applied sweeping frequency excitation.

5. The method as recited in claim 1, wherein a spatial resolution of the MR image produced in step (b) is increased by sequentially exciting a number of sidebands in each voxel of the image using one of amplitude modulation or phase modulation of the sweeping frequency excitation.

6. The method as recited in claim 5, wherein step (b) includes Fourier transforming time domain signals associated with at least one of the sidebands and producing the MR image of the subject from a combination of the Fourier transformed time domain signals.

7. The method as recited in claim 1, wherein a spatial resolution of the image produced in step (b) is increased by increasing a number of frequency domain samples associated with each sideband by using a spatial phase modulation during the sweeping frequency excitation.

8. The method as recited in claim 1, wherein the sweeping frequency excitation is a continuous frequency modulation.

9. The method as recited in claim 8, wherein the continuous frequency modulation is at least one of a linear and a hyperbolic secant modulation.

10. The method as recited in claim 1, wherein the sweeping frequency modulation is a stepped frequency modulation including a number of different discrete frequency steps.

* * * * *